United States Patent

Teggatz et al.

[11] Patent Number: 5,812,006
[45] Date of Patent: Sep. 22, 1998

[54] OPTIMIZED POWER OUTPUT CLAMPING STRUCTURE

[75] Inventors: Ross E. Teggatz, McKinney; Joseph A. Devore, Dallas; Kenneth G. Buss, Dallas; Thomas A. Schmidt, Dallas; Taylor R. Efland, Richardson; Stephen C. Kwan, Plano, all of Tex.

[73] Assignee: Texas Instruments Incorporated, Dallas, Tex.

[21] Appl. No.: 739,375

[22] Filed: Oct. 29, 1996

[51] Int. Cl.⁶ ...................................................... H03K 5/08
[52] U.S. Cl. ........................... 327/309; 327/318; 327/328
[58] Field of Search .................................. 327/110, 309, 327/310, 312, 313, 314, 318, 321, 323, 324, 325, 326, 327, 328

[56] References Cited

U.S. PATENT DOCUMENTS

| | | | |
|---|---|---|---|
| 5,001,373 | 3/1991 | Bator et al. | 327/314 |
| 5,028,811 | 7/1991 | Le Roux et al. | 307/270 |
| 5,347,169 | 9/1994 | Preslar et al. | 327/110 |
| 5,523,714 | 6/1996 | Topp et al. | 327/309 |

Primary Examiner—Timothy P. Callahan
Assistant Examiner—Jeffrey Zweizig
Attorney, Agent, or Firm—Alan K. Stewart; W. James Brady, III; Richard L. Donaldson

[57] ABSTRACT

An optimized power output clamping structure, includes a power output transistor having a first breakdown voltage and a breakdown structure having a second breakdown voltage coupled to the power output transistor. The second breakdown voltage is less than the first breakdown voltage and follows the first breakdown voltage across all temperature and semiconductor process variations. This feature allows a reduction in breakdown voltage guardbanding and increases output structure reliability. A method of protecting a circuit from inductive flyback is also disclosed. The method includes the steps of driving an inductive load with drive circuitry, turning off the inductive load, and clamping an inductive voltage at a voltage magnitude that protects the drive circuitry from breakdown across all temperature and processing variations.

18 Claims, 3 Drawing Sheets

OPTIMIZED POWER OUTPUT CLAMPING STRUCTURE

FIELD OF THE INVENTION

This invention is in the area of integrated circuits and is more particularly related to output clamping mechanisms in power integrated circuits.

BACKGROUND OF THE INVENTION

Many power output structures are required to dissipated energy stored in inductive loads that are being driven by the power output structure. A prior art power output circuit 10 is illustrated in prior art FIG. 1. A power MOS transistor 14 is connected in series with an inductive load 12 and a power supply Vcc. Power MOS transistor 14 also is connected to circuit ground. Power MOS transistor 14 has a diode 16 connected in parallel. Diode 16 typically is implicit in the power MOS transistor layout itself. The mode of the inductive transient is as follows: when a power output which is driving an inductive load is turned off, the voltage at the load begins to rise for a low side driver output configuration and fall for a high side driver output configuration. In either case, the voltage across the power output device increases until the output structure breaks down. When this occurs the energy stored in inductive load 12 is snubbed to ground through the output device. In such a configuration, power MOS transistor 14 is forced to dissipate the inductive energy in a reverse biased mode of operation. In this manner, the breakdown is localized to areas within power MOS transistor 14 structure that have the lowest voltage junction breakdown, thus overall energy handling capability of the output structure is minimized.

Prior art FIG. 2 illustrates another common solution that attempts to increase the energy handling capability of power MOS transistor 14. Prior art circuit 20 of FIG. 2 adds a zener diode 18 between the drain and gate of power MOS transistor 14. Zener diode 18 is designed to breakdown before power MOS transistor 14. In so doing, the zener diode breaks down, thereby charging the gate of power MOS transistor 14 and causing power MOS transistor 14 to turn on in its forward biased mode. In this operation, the inductive energy is dissipated more efficiently and the reliability of power MOS transistor 14 is not compromised. Prior art circuit 20 has a disadvantage in that it has a substantially lower breakdown voltage which is undesirable and well known and understood by those skilled in the art. All present schemes for designing the zener diode, due to processing and temperature variations, require a significant amount of voltage headroom to ensure that, in every case, zener diode 18 breaks down before power MOS transistor 14. Therefore the breakdown voltage of circuit 20 is greatly reduced.

It is an object of this invention to provide a means and methodology for improving the breakdown voltage of the output circuit while simultaneously maintaining a rugged output structure that can withstand substantial inductive energy transients.

It is another object of the invention to provide an output circuit and method that improves the breakdown voltage without substantially increasing circuit area which in prior art solutions has been directly proportional to the output breakdown voltage.

Other objects and advantages of the invention will be apparent to those of ordinary skill in the art having reference to the following specification and drawings.

SUMMARY OF THE INVENTION

An optimized power output clamping structure, includes a power output transistor having a first breakdown voltage and a breakdown structure having a second breakdown voltage coupled to the power output transistor. The second breakdown voltage is less than the first breakdown voltage and follows the first breakdown voltage across all temperature and semiconductor process variations. This feature allows a reduction in breakdown voltage guardbanding and increases output structure reliability. A method of protecting a circuit from inductive flyback is also disclosed. The method includes the steps of driving an inductive load with drive circuitry, turning off the inductive load, and clamping an inductive voltage at a voltage magnitude that protects the drive circuitry from breakdown across all temperature and processing variations.

DETAILED DESCRIPTION OF THE INVENTION

Figure 3:
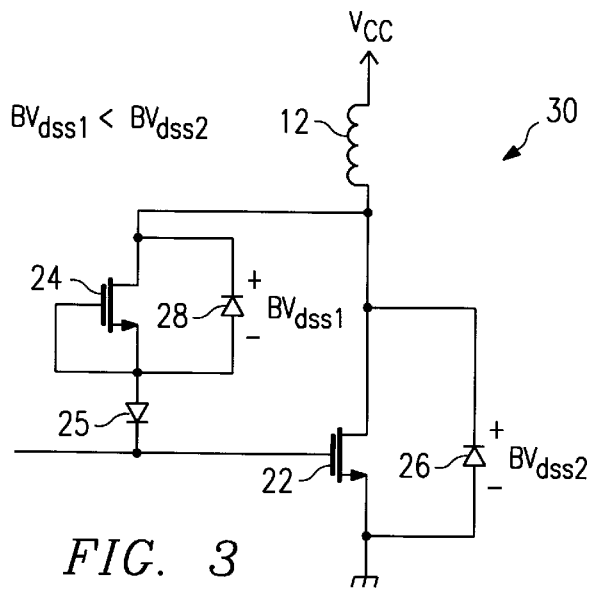
FIG. 3 is a circuit diagram illustrating an embodiment of the invention 30 in a low side driver configuration.

FIG. 3 is a schematic diagram illustrating a circuit 30 as an embodiment of the invention. Circuit 30 is a low side driver configuration. Circuit 30 has an NMOS transistor 22 coupled in parallel with a diode 26. NMOS transistor, in this particular embodiment is a power DMOS type transistor and diode 26 is implicit in transistor 22's semiconductor layout. However, it should be understood that all types of transistors such as PMOS or bipolar transistors would fall within the scope of this invention and may or may not have diode implicit in the device layouts. Transistor 22 is connected in series between a circuit ground potential and an inductive load 12. Inductive load 12 is also connected to a voltage supply potential Vcc. Although this particular implements circuit 30 with a load connected to a voltage supply Vcc, it should be understood that any appropriate voltage potential falls within the scope of this invention. A second NMOS transistor 24 is connected in series with a blocking diode 25. Another diode 28 is connected in parallel with transistor 24. Again, diode 28 is implicit in the device layout of transistor 24, however a separate, diode structure falls within the scope of this invention. Transistor 24 and diode 25 are connected between the drain terminal and the gate terminal of transistor 22. The gate of transistor 22 is also coupled to input type circuitry that is not shown. The input type circuitry provides appropriate output circuitry control for switching inductive load 12 and is well known by those skilled in the art of circuit design.

Figure 4:
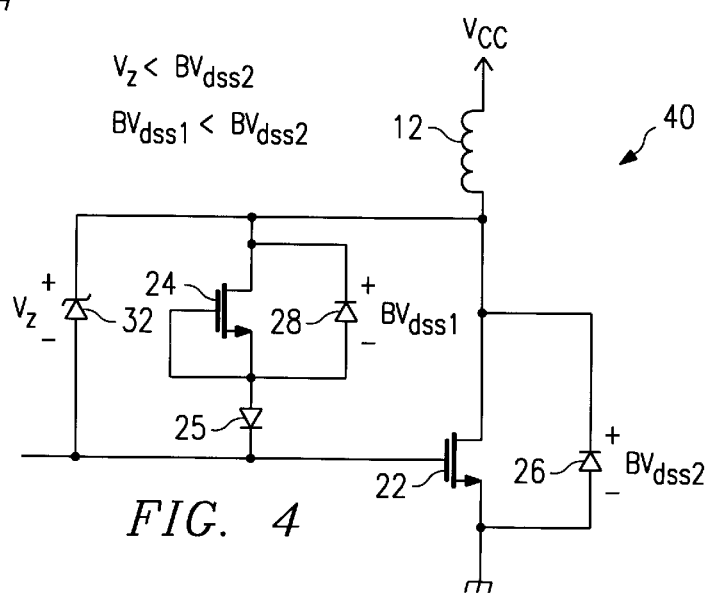
FIG. 4 is a circuit diagram illustrating another embodiment of the invention 40 in a low side driver configuration.

FIG. 4 is a schematic diagram illustrating a circuit 40 as another embodiment of the invention. Circuit 40 is a low side driver configuration. Circuit 40 has NMOS transistor 22 coupled in parallel with diode 26. Transistor 22 is connected in series between circuit ground potential and inductive load 12. Inductive load 12 is also connected to voltage supply Vcc. Second NMOS transistor 24 is connected in series with diode 25. Transistor 24 and diode 25 are connected between the drain terminal and the gate terminal of transistor 22. Diode 28 is connected in parallel with transistor 24. A zener diode 32 is connected in parallel with transistor 24 and diode 25. The gate of transistor 22 is coupled to input type circuitry that is not shown.

Figure 5:
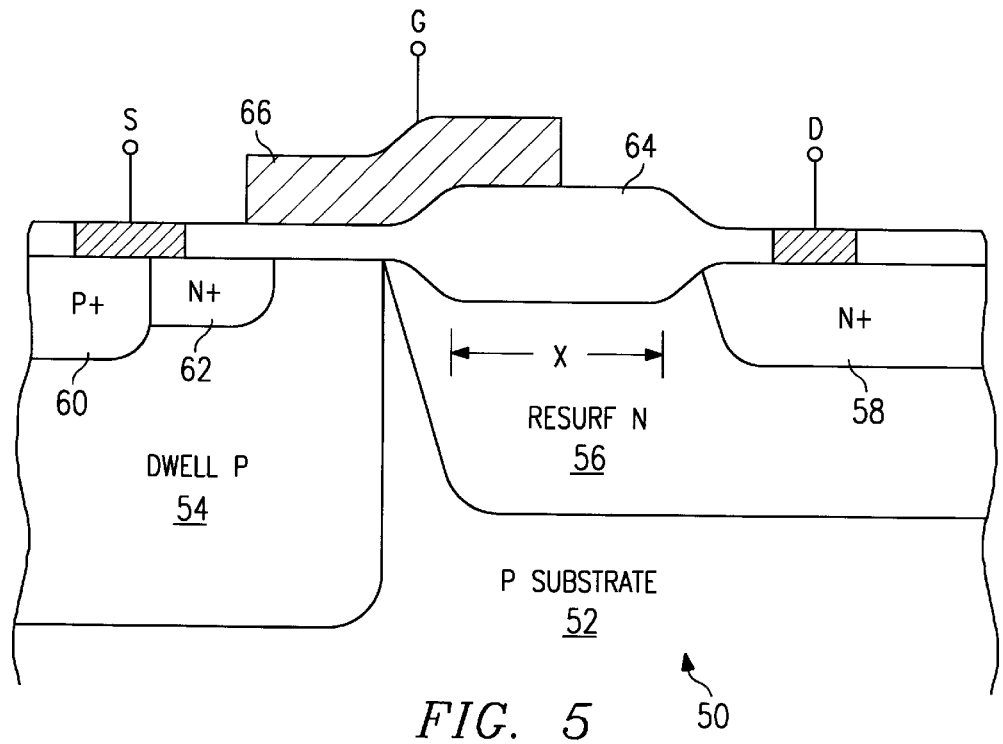
FIG. 5 is a cross-sectional diagram illustrating a RESURF DMOS transistor 50.

FIG. 5 is a cross-sectional diagram illustrating a RESURF type power lateral DMOS transistor 50. Transistor 50 has a P-type DWELL region 54 and an N-type RESURF drift region 56 formed in a semiconductor substrate 52. A source region is formed in DWELL region 54 with N+ region 62. A P+ region 60 acts as a backgate connection A drain region is formed within drift region 56 with N+ region 58. An oxide layer 64 is formed over the face of circuit 50 and contact holes are made for the source backgate and drain to source backgate region 60 and 62 and drain region 58. A polysilicon gate 66 is selectively formed over oxide layer 64 to form the gate of transistor 50. A lateral distance labelled "X" is illustrated in drift region 56.

Figure 5A:
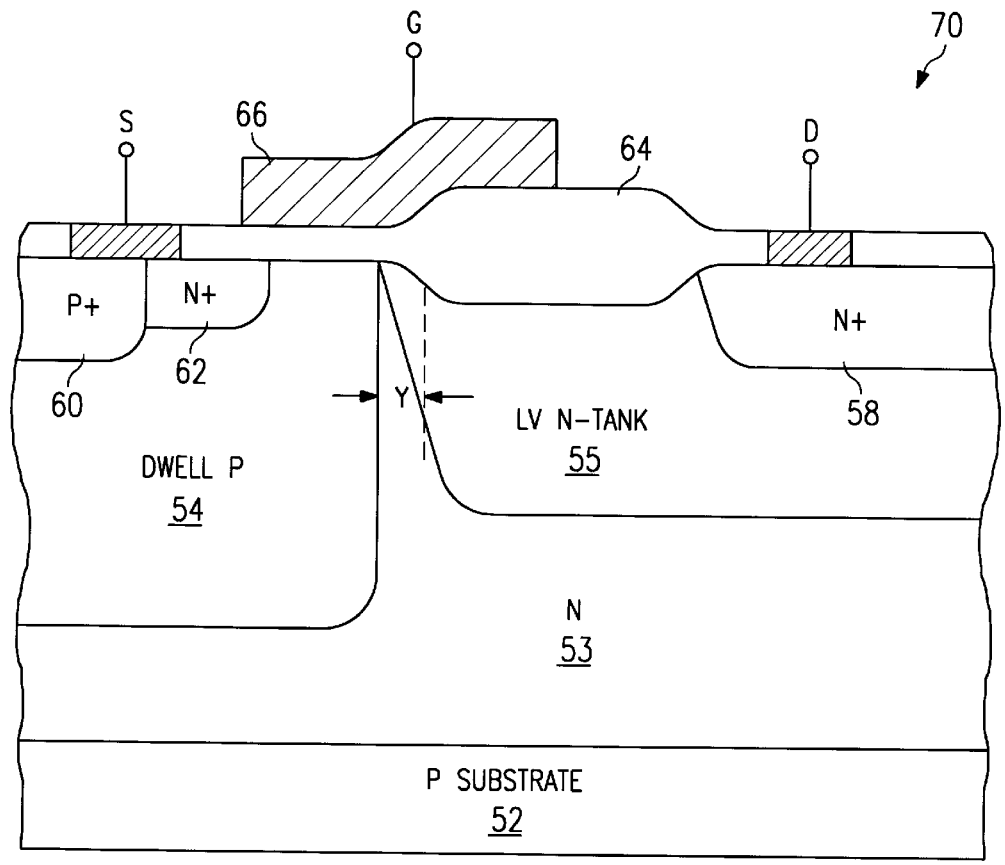
FIG. 5a is a cross-sectional diagram illustrating a standard DMOS transistor 70 with an added drift region enhancer 55.

FIG. 5a is a cross-sectional diagram illustrating, a standard LDMOS type power transistor 70 having an enhanced drift region diffusion 55. Transistor 70 has an N type region 53 formed over semiconductor substrate 52. N type region 53 has a P-type DWELL region 54 and a low voltage N-tank region 55 (LV N-TANK) formed within it Source region is formed in DWELL region 54 with P+ region 60 and N+ region 62. Drain region is formed within LV N-TANK region 55 with N+ region 58. Oxide layer 64 is formed over the face of circuit 70 and contact holes are made for the source backgate and drain to source backgate region 60 and 62 and drain region 58. Polysilicon gate 66 is selectively formed over oxide layer 64 to form the gate of transistor 70. A lateral distance labelled "Y" is illustrated in LV N-TANK region 55.

Figure 6:
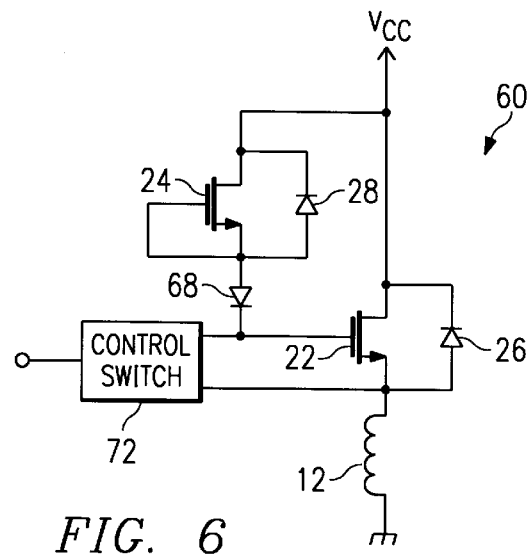
FIG. 6 is a circuit diagram illustrating an embodiment of the invention in a high side driver configuration 60.

FIG. 6 is a schematic diagram illustrating a circuit 60 as another embodiment of the invention. Circuit 60 is a high side driver configuration. Transistor 22 is connected in parallel with diode 26. Transistor 22 is connected in series with inductive load 12 and voltage supply potential Vcc. Transistor 24 is connected in parallel with diode 28. Transistor 24 is connected in series with a blocking diode 68. Transistor 24 and diode 68 are connected between the drain terminal and gate terminal of transistor 60. A control switch circuit 72 is connected between the gate terminal and source terminal of transistor 22. Control switch circuit 72 is also connected to input control circuitry (not shown) for controlling the switching of circuit 60.

Circuit 60 would also operate using vertical DMOS structures as well as for NPN and PNP bipolar structures. This invention contemplates all types of transistor output structures that utilize an alteration in design spacing to ensure breakdown protection across all temperature and semiconductor processing variations.

Figure 7:
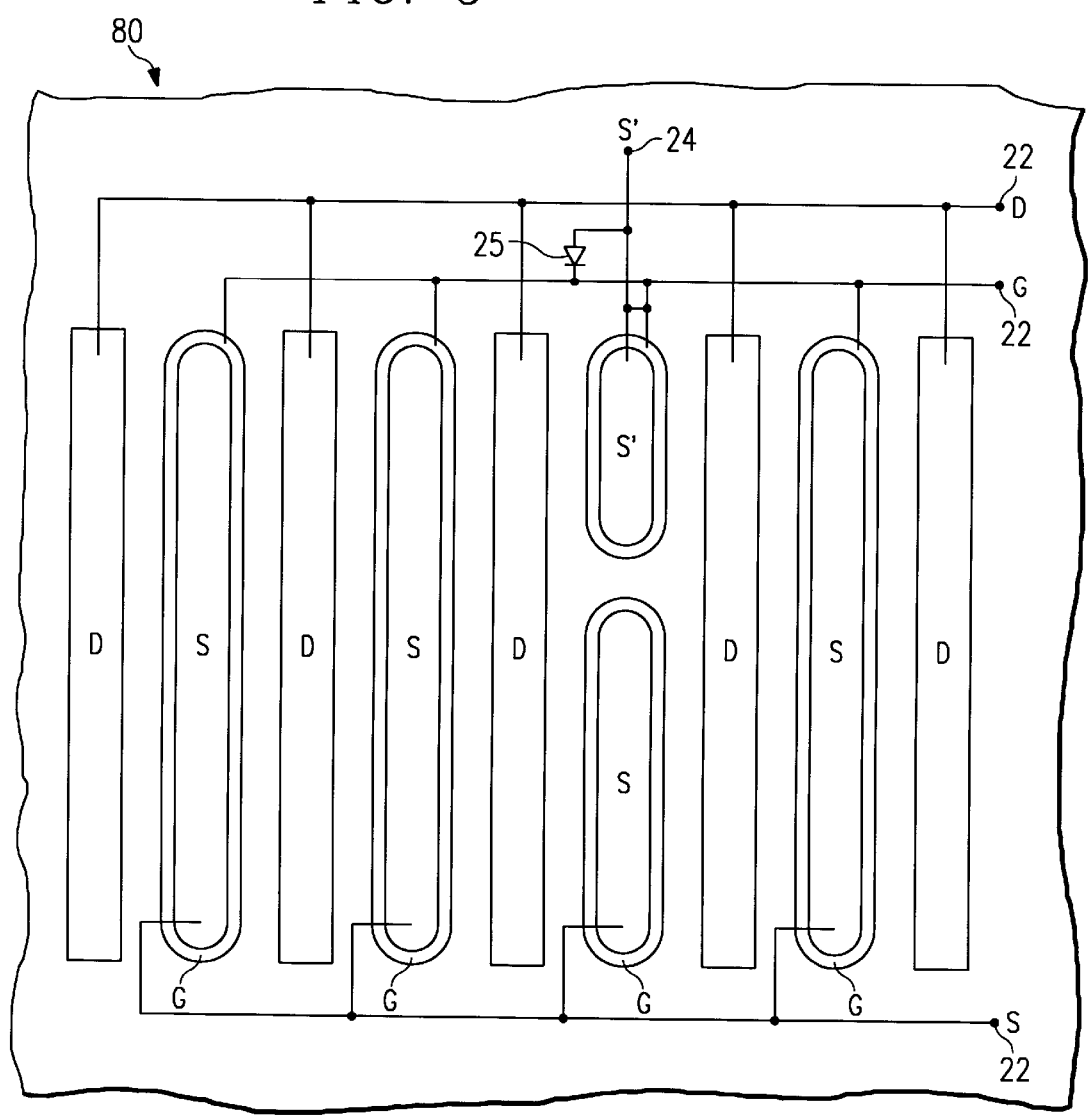
FIG. 7 is a circuit device layout diagram illustrating circuit 30 in a layout embodiment of the invention.

FIG. 7 is a top view diagram illustrating a semiconductor circuit layout of circuit 30 of FIG. 3. FIG. 7 illustrates a multi-fingered output DMOS type transistor 22 with transistor 24 embedded within transistor 22 layout. Having transistor 24 physically embedded within transistor 22 layout provides improved thermal following by ensuring that both transistor 22 and 24 are experiencing identical thermal gradients that exist across semiconductor dies.

Circuit 30 of FIG. 3 operates in the following manner. When transistor 22 is conducting input circuitry (not shown) has the gate terminal at a sufficient voltage to keep transistor 22 on. The drain terminal, during conduction of transistor 22, is approximately at $V_{DRAIN}=I_{DRAIN} \times Rds(on)$ and is therefore dependent upon the product of the drain current and the Rds(on) of transistor 22. Blocking diode 25 acts to prevent current from flowing through diode 28 to transistor 22 when transistor 22 is on. When input circuitry turns transistor 22 off the gate voltage drops to approximately circuit ground potential When transistor 22 stops conducting inductive flyback occurs at its drain terminal because current cannot change instantaneously through an inductor. Transistor 24 is designed with the same semiconductor device layout as transistor 22 except it has different device spacings that ensure it has a breakdown voltage that is less than the breakdown voltage of transistor 22. Such variations in device spacings may be accomplished in various ways. One manner of modifying layout spacings for transistor 24 is illustrated in FIGS. 5 and 5a. In FIG. 5 a RESURF DMOS transistor 50 may modify its RESURF drift region spacing labelled "X" to vary its device breakdown. Similarly, in FIG. 5a a standard DMOS transistor 70 may vary the lateral spacing labelled "Y" (the spacing between tanks 54 and 55). Other spacing modifications that vary breakdown voltage also fall within the scope of this invention. Therefore, by modifying transistor 24's layout spacing one can ensure that its breakdown voltage ($BV_{dss1}$) is lower in magnitude than the breakdown voltage of transistor 22 ($BV_{dss2}$). When transistor 24 breaks down current flows through transistor 24 and diode 25 to the gate of transistor 22, which charges the gate capacitance and thereby increases the voltage at the gate of transistor 22. When the gate voltage reaches a threshold voltage above ground potential, transistor 22 turns on again and discharges the energy stored in inductive load 12. In this manner, the energy stored in inductive load 12 is discharged through transistor 22 while transistor 22 is in its forward biased mode, rather than in its reverse biased breakdown mode. Therefore the energy stored in inductive load is discharged in an efficient manner.

Figure 1:
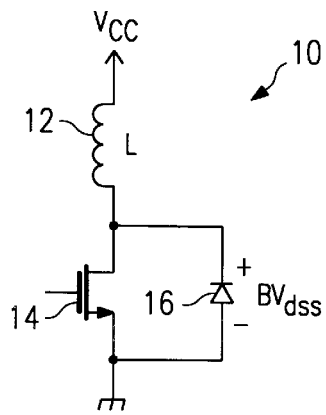
FIG. 1 is a prior art circuit diagram illustrating an output circuit 10.
Figure 2:
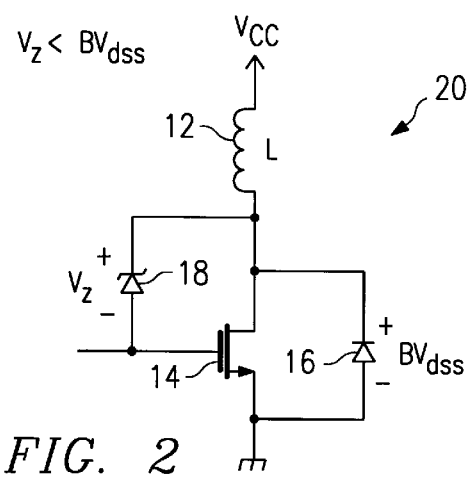
FIG. 2 is another prior art circuit diagram illustrating another output circuit 20.

Circuit 30 presents a substantial improvement over prior art solutions such as prior art zener stack circuit 20 of FIG. 2. Prior art circuit 20 has a zener diode 18 that has a breakdown voltage $V_Z$ that varies over temperature and process variations in a manner substantially different from the breakdown voltage variation of transistor 14 ($BV_{dss}$). In other words, the temperature coefficients of zener diode 18 and transistor 14 vary from one another and the component's respective breakdown voltage characteristics vary differently over semiconductor process variations. Therefore, to ensure zener diode breaks down prior to $BV_{dss}$ in FIG. 2 across all temperature and process variations, substantial guardband is required for zener diode 18, thereby decreasing circuit performance as is well known by those skilled in the art. Circuit 30, however, has transistor 24 that has a breakdown voltage $BV_{dss1}$ that directly follows the breakdown voltage of transistor 22 ($BV_{dss2}$) across all temperature and processing variations because the breakdown voltage is directly proportional to the device layout spacing. The thermal following is achieved since the physics impacting the breakdown voltage are the same for the like devices. Therefore, by design (varying the semiconductor device layout spacing), transistor 24 may provide effective, efficient breakdown protection of transistor 22 without unnecessary guardband protection, thereby substantially improving circuit performance and reliability.

In circuit 40 of FIG. 4 a zener diode 32 is coupled in parallel with transistor 24. This circuit implementation may be desirable when a maximum range is specified for the output breakdown voltage. This type of breakdown circuitry may be beneficial if, for example, the breakdown voltage of transistor 22 (BV$_{dss2}$) was in the range of 60–75V over all process and temperature variations and an application specification required an output breakdown voltage from 60–65V. Zener diode may be centered at 63V and with process and temperature variations range from 61–65V. In this example, if the breakdown voltage of transistor 22 is 60V then transistor 24 will by design due to variations in device layout spacings breakdown before it. Yet if, due to semiconductor processing variation, the breakdown voltage of transistor 22 is 75V, zener diode 32 will ensure that it breaks down at a voltage no higher than 65V.

FIG. 6 is a high side driver solution that utilizes the same novel temperature and process following methodology to ensure low guardbanded, efficient breakdown protection for circuit 60. When input circuitry (not shown) is driving output circuit 60, control switch 72 has an effective closed circuit between the input circuitry and the gate of transistor 22 and an effective open circuit between the gate and source of transistor 22. When input circuitry turns off transistor 22, control switch 72 creates an effective resistive short circuit between the gate and source of transistor 22, thus discontinuing its conduction. When transistor 22 turns off, the source of transistor 22 goes low due to the inductive flyback of inductive load 12. Because an approximate short circuit (yet still somewhat resistive) exists between the gate and source of transistor 22, transistor 24 and blocking diode 68 are effectively in parallel with transistor 22 and will breakdown first because transistor 24 is designed to have a lower breakdown. Therefore $<BV_{dss1} <BV_{dss2}$. As stated above, transistor 24 may be altered as illustrated in FIG. 5 or 5a to have a lower breakdown voltage by design. Further, the breakdown voltage of transistor 24 will follow the breakdown voltage of transistor 22 across all temperature and processing characteristics. When transistor 24 breaks down it charges the gate of transistor 22 to a higher potential than the source and transistor 22 turns back on, effectively dissipating the energy stored in inductive load efficiently in a forward biased mode.

In FIG. 7, circuit 30 of FIG. 3 is illustrated in a semiconductor circuit layout. More specifically, FIG. 7 illustrates a device layout of transistor 22. Transistor 22 has multiple drain diffusions 82 and source diffusions 84. Source diffusions appear surrounded by polysilicon gates 86. However, as is well known by those skilled in the art, top view layouts do not provide a fully accurate representation of a transistor's cross section. In FIG. 7, breakdown transistor 24 is embedded within transistor 22. Therefore, the thermal gradients experienced by transistor 22 will also be experienced by transistor 24. This feature allows guardbanding between the breakdown voltages of transistors 22 and 24 to be reduced even further.

Alternatively, thermal effects on breakdown voltage can be further reduced by laying out multiple, small LDMOS transistors within the large LDMOS structure, thereby making the breakdown performance even less sensitive to localized thermal gradients.

Although the invention has been described with reference to the embodiments herein, this description is not to be construed in a limiting sense. Various modifications of the disclosed embodiments will become apparent to persons skilled in the art upon reference to the description of the invention. It is therefore contemplated that the appended claims will cover any such modifications or embodiments as fall within the true scope of the invention.

What is claimed is:

1. An optimized output clamping structure, comprising:
    a output transistor having a first breakdown voltage;
    a breakdown transistor having a substantially similar structural device layout as the output transistor, but modified slightly to ensure a breakdown voltage lower than the breakdown voltage of the output transistor and that follows breakdown voltage variations of the output transistor across all temperature and semiconductor process variations; and
    a zener diode coupled in parallel with the breakdown transistor.

2. The structure of claim 1, further comprising a blocking diode connected in series with the breakdown transistor, thereby preventing current flow through the breakdown transistor from the gate to the drain of the output transistor when the output transistor is conducting.

3. The structure of claim 2, wherein the blocking diode is integrated into the semiconductor device layout of the transistor.

4. An optimized power output clamping circuit for driving an inductive load, comprising:
    a power MOS transistor having a first breakdown voltage, the power MOS transistor having a drain coupled to the load, a source, and a gate; and
    a breakdown structure connected across the drain and gate of the power MOS transistor, wherein the breakdown structure has a second breakdown voltage, the second breakdown voltage being less than the first breakdown voltage across all temperature and semiconductor processing variations, thereby causing the breakdown transistor to break down when switching the load off and subsequently turning the power MOS transistor on to dissipate energy stored in the load in an efficient manner, and
    a zener diode connected in parallel with the breakdown structure.

5. The optimized power output clamping circuit of claim 4, wherein the breakdown structure comprises a transistor having a drain connected to the drain of the power MOS transistor and a gate and source connected to the gate of the power MOS transistor.

6. The optimized power output clamping circuit of claim 5, wherein the power MOS transistor has a first set of semiconductor layout spacings which dictate a first breakdown voltage, and wherein the breakdown transistor has a second set of semiconductor layout spacings which dictate a second breakdown voltage, and wherein the second breakdown voltage is less than the first breakdown voltage across all temperature and semiconductor processing variations.

7. An optimized power output clamping structure, comprising:
    a first lateral RESURF DMOS transistor having a drift region of a first length; and
    a second lateral RESURF DMOS transistor having a drift region of a second length coupled to the first lateral RESURF DMOS transistor, wherein the drift region of a second length is longer than the drift region of a first length, thereby ensuring the second lateral RESURF DMOS transistor has a higher breakdown voltage than the first lateral RESURF DMOS transistor across all temperature and semiconductor processing variations.

8. The structure of claim 7, further comprising a zener diode coupled in parallel with the second lateral RESURF DMOS transistor.

9. An optimized power output clamping circuit for driving an inductive load, comprising:

a first lateral RESURF DMOS transistor having a drift region of a first length and a first breakdown voltage, the first lateral RESURF DMOS transistor having a drain coupled to the inductive load, a source and a gate;

a second lateral RESURF DMOS transistor having a drift region of a second length connected across the drain and gate of the first lateral RESURF DMOS transistor, wherein the drift region of a second length is longer than the drift region of a first length, thereby ensuring the second lateral RESURF DMOS transistor has a higher breakdown voltage than the first lateral RESURF DMOS transistor across all temperature and semiconductor processing variations; and operable to break down when the first lateral RESURF DMOS transistor turns off, thereby protecting the first lateral RESURF DMOS transistor from breakdown during inductive flyback by conducting and charging the gate of the first lateral RESURF DMOS transistor, thereby turning the first lateral RESURF DMOS transistor back on and dissipating energy stored in the inductive load efficiently.

10. The circuit of claim 9, wherein the second lateral RESURF DMOS transistor has a drain connected to the drain of the first lateral RESURF DMOS transistor and a gate and source connected to the gate of the first lateral RESURF DMOS transistor.

11. An optimized output clamping circuit for driving an inductive load, comprising:

a first bipolar transistor having a first breakdown voltage, the first transistor having a first terminal coupled to the inductive load, a second terminal and a control terminal;

a second bipolar transistor connected across the first terminal and control terminal of the first transistor, and wherein the second transistor has a modified layout spacing thereby resulting in a second breakdown voltage and wherein the second breakdown voltage is guaranteed by layout design to be less than the first breakdown voltage across all temperature and semiconductor processing variations; and operable to break down when the first transistor turns off, thereby protecting the first transistor from breakdown during inductive flyback by conducting and activating the control terminal of the first transistor, thereby turning the first transistor back on and dissipating energy stored in the inductive load efficiently.

12. The circuit of claim 11, wherein the first and second bipolar transistors are NPN transistors.

13. The circuit of claim 11, wherein the first and second bipolar transistors are PNP transistors.

14. A method of laying out a breakdown structure within an output circuit, wherein the breakdown structure has a breakdown voltage that follows a breakdown voltage of the output circuit across all temperature and semiconductor processing variations, comprising the steps of:

laying out a breakdown structure on a semiconductor die, wherein the breakdown structure has a first spacing, wherein the first spacing dictates a breakdown voltage for the breakdown structure; and laying out an output circuit, wherein the output circuit surrounds the breakdown structure, and wherein the output circuit has a second spacing, wherein the second spacing dictates a breakdown voltage for the output circuit that is greater in magnitude than the breakdown voltage of the breakdown structure, and wherein the first spacing and second spacing vary substantially identically over all temperature and semiconductor processing variations, and wherein the breakdown structure, by being surrounded by the output circuit, experiences the same thermal gradients as the output circuit.

15. The method of claim 14, further comprising the step of laying out a plurality of breakdown structures each connected together in parallel in a plurality of locations within the output circuit, thereby providing less sensitivity to localized thermal gradients across the output circuit.

16. A method of laying out an output structure, wherein the output structure has a breakdown structure associated with the output structure and wherein the breakdown structure has a breakdown voltage that follows a breakdown voltage of the output circuit across all temperature and semiconductor processing variations, comprising the steps of:

laying out an output circuit, wherein the output circuit has a first spacing and wherein the first spacing dictates a first breakdown voltage;

laying out a breakdown structure adjacent to the output circuit, wherein the breakdown structure has a second spacing, wherein the second spacing dictates a second breakdown voltage and wherein the second breakdown voltage is less than the first breakdown voltage across all semiconductor processing variations and wherein the adjacent positioning of the breakdown structure to the output circuit ensures that both the output circuit and the breakdown structure experience substantially the same thermal gradients, thereby further ensuring that the second breakdown voltage is less than the first breakdown voltage across all temperature variations; and laying out a zener diode in parallel with the breakdown structure.

17. An optimized output clamping circuit for driving an inductive load, comprising:

a first lateral DMOS transistor having a first breakdown voltage, the first transistor having a first terminal coupled to the inductive load, a second terminal and a control terminal;

a second lateral DMOS transistor connected across the first terminal and control terminal of the first transistor, and wherein the second transistor has a modified layout spacing thereby resulting in a second breakdown voltage and wherein the second breakdown voltage is guaranteed by layout design to be less than the first breakdown voltage across all temperature and semiconductor processing variations; and operable to break down when the first transistor turns off, thereby protecting the first transistor from breakdown during inductive flyback by conducting and activating the control terminal of the first transistor, thereby turning the first transistor back on and dissipating energy stored in the inductive load efficiently.

18. An optimized output clamping circuit for driving an inductive load, comprising:

a first vertical DMOS transistor having a first breakdown voltage, the first transistor having a first terminal coupled to the inductive load, a second terminal and a control terminal;

a second vertical DMOS transistor connected across the first terminal and control terminal of the first transistor, and wherein the second transistor has a modified layout spacing thereby resulting in a second breakdown voltage and wherein the second breakdown voltage is guaranteed by layout design to be less than the first breakdown voltage across all temperature and semiconductor processing variations; and operable to break down when the first transistor turns off, thereby protecting the first transistor from breakdown during inductive flyback by conducting and activating the control terminal of the first transistor, thereby turning the first transistor back on and dissipating energy stored in the inductive load efficiently.

\* \* \* \* \*